United States Patent [19]

Baumann

[11] Patent Number: 5,683,947
[45] Date of Patent: Nov. 4, 1997

[54] METHOD FOR PRODUCING A COMPONENT ACCORDING TO THE ANODIC BONDING METHOD AND COMPONENT

[75] Inventor: Helmut Baumann, Gomaringen, Germany

[73] Assignee: Robert Bosch GmbH, Stuttgart, Germany

[21] Appl. No.: 511,570

[22] Filed: Aug. 4, 1995

[30] Foreign Application Priority Data

Aug. 13, 1994 [DE] Germany .................. 44 28 808.5

[51] Int. Cl.⁶ .................................... H01L 21/326
[52] U.S. Cl. ................... 437/250; 437/225; 437/974; 148/DIG. 12
[58] Field of Search ................... 437/250, 212, 437/216, 927, 974, 225; 148/DIG. 12, DIG. 135

[56] References Cited

U.S. PATENT DOCUMENTS

| | | |
|---|---|---|
| 4,638,552 | 1/1987 | Shimbo et al. ............... 148/DIG. 12 |
| 4,818,323 | 4/1989 | d'Aragona et al. ............... 148/DIG. 12 |
| 4,975,390 | 12/1990 | Fujie et al. ................... 148/DIG. 135 |
| 5,006,487 | 4/1991 | Stokes ........................ 148/DIG. 12 |
| 5,147,821 | 9/1992 | McShane et al. ................ 437/212 |
| 5,300,175 | 4/1994 | Gardner et al. ................ 148/DIG. 12 |
| 5,304,512 | 4/1994 | Arai et al. .................... 437/212 |
| 5,504,032 | 4/1996 | Gessner et al. ................ 148/DIG. 12 |

FOREIGN PATENT DOCUMENTS

| | | | |
|---|---|---|---|
| 39 14 015 | 10/1990 | Germany . | |
| 61-222146 | 10/1986 | Japan | 148/DIG. 12 |
| 62-85470 | 4/1987 | Japan | 148/DIG. 12 |
| 0225050 | 1/1990 | Japan | 148/DIG. 12 |
| 04144196 | 5/1992 | Japan | 148/DIG. 12 |

*Primary Examiner*—Michael Trinh
*Attorney, Agent, or Firm*—Kenyon & Kenyon

[57] ABSTRACT

An anodic bonding method allows uniform pressure on the components to be bonded. This is achieved in that the components which are bonded are structured such that cavities are formed between the components. The cavities are evacuated and the components are thus pressed together during bonding.

10 Claims, 3 Drawing Sheets

METHOD FOR PRODUCING A COMPONENT ACCORDING TO THE ANODIC BONDING METHOD AND COMPONENT

BACKGROUND INFORMATION

A method for producing a component according to the anodic bonding method is known from German Patent Application No. DE 39 14 015. In this case, a silicon single-crystal component which has an alkali-containing glass layer is fitted together with a second silicon single-crystal component and pressed together with a pressure of at least 0.05 newton per square millimeter. The two components are maintained at a temperature of approximately 650° C. for approximately one hour, a voltage being simultaneously applied to the silicon single-crystal components. After cooling off the components, the voltage is subsequently switched off. A component is thus obtained which consists of two components which are connected to one another by means of a bonding connection.

SUMMARY OF THE INVENTION

The method according to the present invention has the advantage over the above-described method that the application force is distributed by means of partial vacuum uniformly over the entire area of the components to be bonded. Furthermore, there is no requirement for special devices for producing the application pressure, which devices could additionally cause damage to the components. Since no device for pressing on the components is necessary, it is also not possible for removal of heat to take place, which causes a non-constant temperature over the surface of the components and thereby negatively influences the bonding process.

It is particularly advantageous to use a holder device, on which the components lie during the anodic bonding process, the holder device having suction channels via which suction is applied to the through-opening or the cavity between the components. A further improvement of the method is achieved in that the holder device is designed as a heating device.

It is furthermore advantageous to arrange a suction device which applies suction to the through-opening of a component or, via the through-opening, to the cavity between the components.

It is particularly advantageous for the suction device to be simultaneously used as a contact electrode. Simpler construction for carrying out the method is thereby possible. The method is advantageously extended in that, for connecting a plurality of components, a top component is used for sealing and for making contact and is not bonded together with the component located underneath.

An advantageous development of the cavity results from arranging a surrounding groove around a fixed region, for example around an individual chip, of a silicon wafer, all the grooves being connected to one another. As a result of this, pressure is uniformly applied to each fixed region of the silicon wafer.

The component according to the present invention has in comparison the advantage that the components to be bonded are pressed together reliably with the aid of a partial vacuum. As a result of this, the quality of the bonding connection is improved.

By introducing grooves around fixed regions, in particular individual chips, of a silicon wafer, the component is improved since, as a result, each fixed region experiences the same application pressure during bonding and it is therefore guaranteed that all fixed regions are bonded with high reliability. The solidity of the bonding connection is thereby guaranteed for each fixed region.

DETAILED DESCRIPTION

Figure 1:
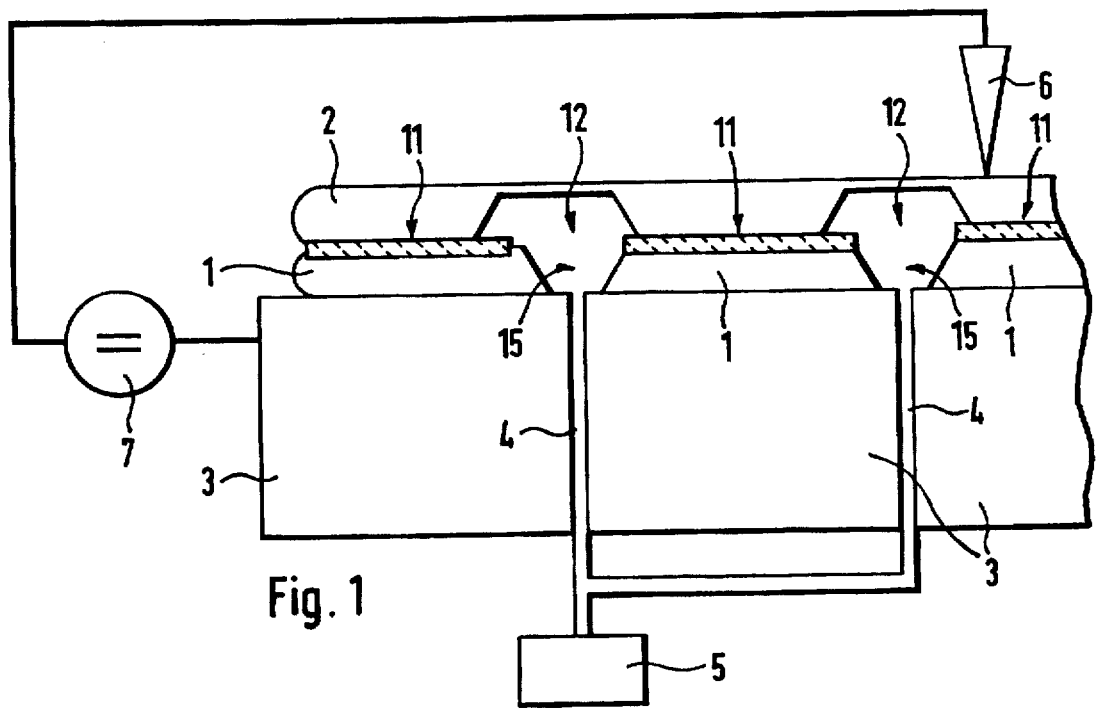
FIG. 1 shows an anodic bonding arrangement with two components, according to the present invention.

FIG. 1 schematically shows a holder device 3 on which a first component 1 lies. The first component 1 represents, in cross section, a structured silicon wafer which has through-openings 15. The first component 1 has a glass layer 11 on the surface remote from the holder device 3, which glass layer is suitable for the anodic bonding process. There is a second component 2, which represents a structured silicon wafer, on the first component 1. It is also possible for the second component 2 to carry the glass layer 11. Use is preferably made of alkali-containing, low-melting glasses. The first component 1 and the second component 2 are structured such that cavities 12 are formed between the first and second components 1, 2, at least one through-opening 15, which is connected to the cavity 12, being made in the first component 1.

In simple cases, through-openings 15 in the first or second component are sufficient, the through-openings being closed off by the second or first component and thus likewise forming cavities.

The holder device 3 has suction channels 4 which are connected to a suction device 5. The first component 1 is arranged on the holder device 3 such that the through-openings 15 in the component 1 are in the region of the suction channels 4. The first component 1 and the second component 2 may be formed of any desired electrically conductive materials which are suitable for the anodic bonding method. Any material which is suitable for the anodic bonding process may be used as the bonding layer. In particular, use is made of alkali-containing glasses or low-melting glasses such as, for example, Pyrex 7740.

The holder device 3 is connected to a voltage source 7. The second component 2 is supplied with voltage from the voltage source 7 via a contact electrode 6. The holder device 3 is, in this exemplary embodiment, designed as a heating device. Instead of the heating device, use may also be made of other methods for heating the components 1, 2, such as, for example, heating radiators.

The method which is represented in FIG. 1 functions as follows: the first component 1 is placed on the heating device 3, with the alkali-containing glass layer 11 upward. The second component 2 is placed on the alkali-containing glass layer 11. The first component 1 and the second component 2 are heated to a temperature of approximately 400° C. using the heating device 3. A voltage is subsequently applied to the first component 1 and the second component 2 via the contact electrode 6 and the heating device 3. The voltage is in the range of from 50 to 200 V. The first component 1 and the second component 2 are pressed against each other at their surfaces using the suction device 5, by producing a partial vacuum in the cavities 12 which are arranged between the first component 1 and the second component 2. The bonding process is thereby initiated. After cooling, turning off the voltage and switching off the partial vacuum, a component is obtained which includes the first component 1 and the second component 2.

Figure 2:
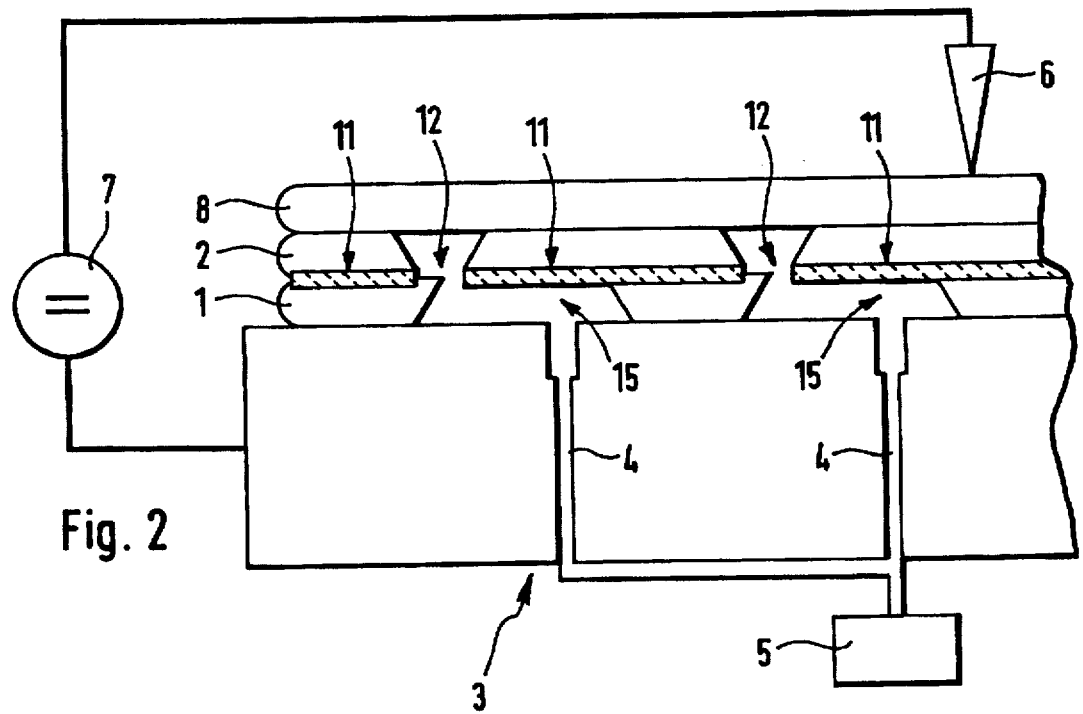
FIG. 2 shows an anodic bonding arrangement with three components, the upper component not being bonded, according to the present invention.

FIG. 2 shows the first component 1 which lies on the heating device 3. The second component 2 lies on the first component 1. The first component 1 and the second component 2 have through-openings 15. The first component 1 and the second component 2 lie on one another such that the through-openings 15 are arranged above one another and are located in the region of the suction channels 4 of the heating device 3. The first component 1 and the second component 2 represent, for example, a structured silicon wafer. A top component 8 having no through-openings 15 is arranged on the second component 2. The through-openings 15 in the component 1 and in the other component 2 thereby form cavities 12. The contact electrode 6 lies on the top component 8. An alkali-containing glass layer 11, which is applied either onto the first or onto the second component 1, 2, is arranged between the first component 1 and the second component 2. No alkali-containing glass layer 11 is introduced between the second component 2 and the top component 8. The top component 8 may be produced from any desired conductive material which permits sealing of the cavities 12. In this exemplary embodiment, a silicon wafer is used.

The arrangement according to FIG. 2 functions as follows: the bonding method is carried out according to FIG. 1, a voltage being applied to the first component 1 and the top component 8. The top component 8 is in this case used for making electrical contact with the second component 2 and for sealing the cavities 12. The top component 8 is not connected to the second component 2 during the bonding process. After the bonding process, the top component 8 is removed and a component is obtained which includes the first component 1 and the second component 2. Two bonded silicon wafers are thereby obtained.

Figure 3:
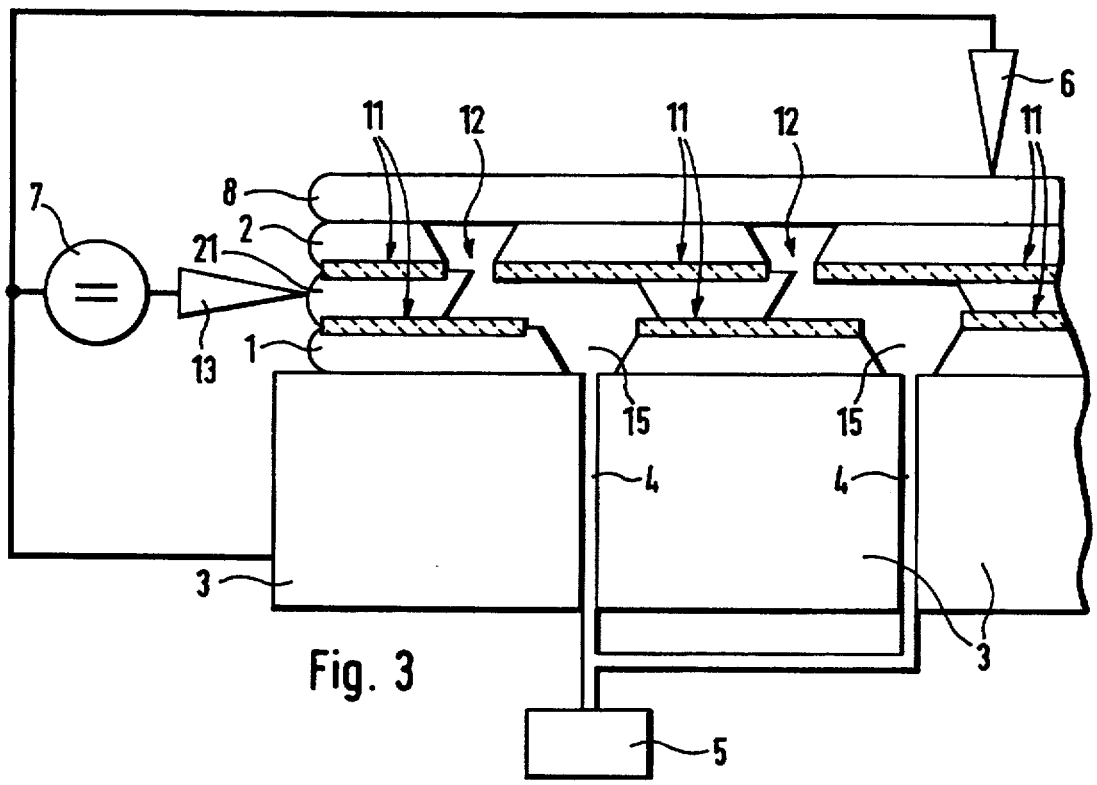
FIG. 3 shows an anodic bonding arrangement with a plurality of components, according to the present invention.

FIG. 3 shows an arrangement according to FIG. 2, but with three components 1, 21, 2 being connected to one another. The first component 1 lies on the heating device 3. Another component 21 lies on the first component 1. The second component 2 lies on the other component 21 and a top component 8 is arranged on the second component 2. The first component 1, the other component 21 and the second component 2 have through-openings 15. The top component 8 does not have any through-openings 15 and is used for sealing the through-openings 15 and as an electrical contact.

The first component 1, the other component 21, the second component 2 and the top component 8 are placed on one another such that the through-openings 15 form closed-off cavities 12. An alkali-containing glass layer 11 is in each case arranged on the upper side of the first component 1 or the lower side of the other component 21 and on the upper side of the other component 21 or the lower side of the second component 2.

The top component 8 and the first component 1 are supplied with the same potential via a contact electrode 6 and via the heating device 3, respectively. Another contact electrode 13 applies a corresponding counter potential to the other component 21. By this means, despite the four components 1, 21, 2, 8 arranged above one another, a high potential difference is achieved between the first component 1 and the other component 21 or between the other component 21 and the second component 2, for the bonding process. Of course, it is also possible to bond more than three components to one another in this way.

The method which is represented in FIG. 3 functions as follows: a partial vacuum is produced, using the suction device 5 via the suction channels 4, in the through-openings 15 or the cavities 12 which are arranged between the first component 1, the other component 21 and the second component 2. The arrangement including the first component 1, the other component 21 and the second component 2 is in this way pressed together by the top component 8 and the heating device 3. Subsequently, corresponding to the method according to FIG. 1, the arrangement is heated using the heating device 3 to a fixed temperature and a corresponding voltage is applied to the first component 1, the other component 21 and to the second component 2 by means of the voltage source 7.

The top component 8 is removed after the bonding process and one component comprising three bonded components 1, 21, 2 is obtained.

Figure 4:
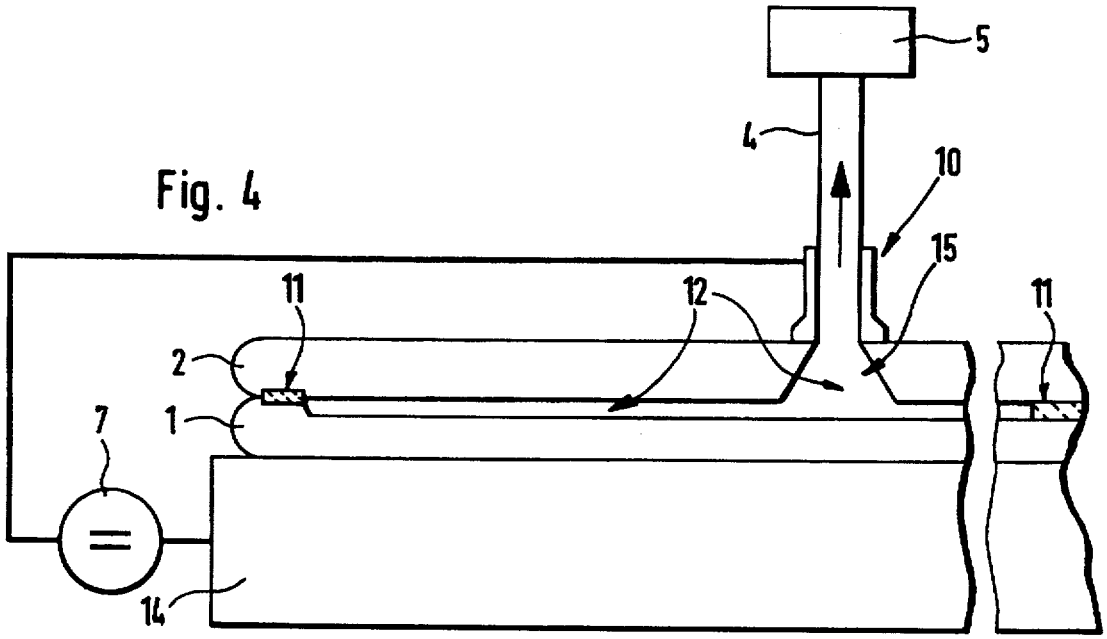
FIG. 4 shows an anodic bonding arrangement with a suction device, according to the present invention.

FIG. 4 shows another holder device 14 which does not have any suction channels. A first component 1, which carries an alkali-containing glass layer 11 on its upper side, lies on the other holder device 14. The second component 2 lies on the first component 1 and has a through-opening 15. In the region of the through-opening 15, a suction device 10 is attached on the upper side of the other component 2. A suction device 5 is connected to this suction device 10 via a suction channel 4. The first component 1 and the second component 2 are structured such that a cavity 12 is formed between the first component 1 and the second component 2, which cavity includes, for example, channels connected to one another.

The suction device 10 simultaneously forms the electrical contact used to connect the second component 2 to the voltage source 7. The voltage source 7 is additionally connected to the other holder device 14. The bonding method functions analogously to FIGS. 1 to 3, but with the corresponding potential fed to the second component 2 via the suction device 10 and with the cavity 12 between the first component 1 and the second component 2 being evacuated, using the suction device 10, via the suction channel 4, with the aid of the suction device 5. As a result of this, the first component 1 and the second component 2 are pressed together. The method, with the use of the suction device 10, can also be employed in the case of a plurality of components to be bonded to one another, corresponding to FIGS. 2 and 3.

The components 1, 2, 21 may be structured in any desired way, but it is advantageous for the cavities 12 to be uniformly distributed over the corresponding component 1, 21, 2.

Figure 5:
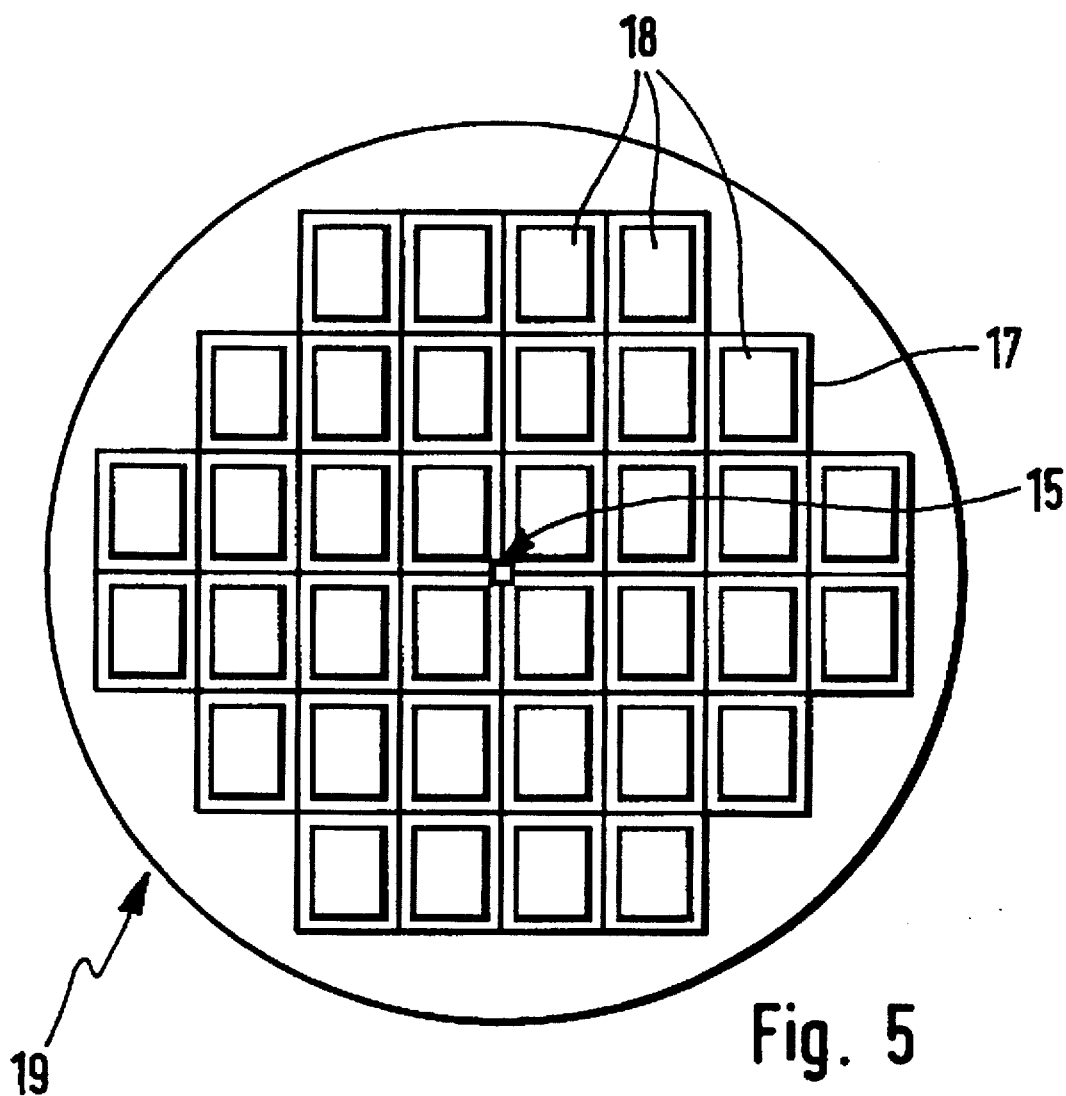
FIG. 5 shows a structured silicon wafer, according to the present invention.

FIG. 5 schematically shows a silicon wafer 19 which is divided into fixed regions, into individual chips 18. The individual chips 18 are in each case enclosed by a closed groove 17 and the grooves 17 are interconnected. A through-opening 15 is arranged in the middle of the silicon wafer 19.

If a first component 1 or a second component 2 is structured corresponding to the silicon wafer 19, and the grooves 17 lie, during bonding, between the first and the second or other component 1, 2, 21, then the grooves 17 form a cavity 12 corresponding to the described method. Suction is applied to the cavity 12 via the through-opening 15.

By virtue of the arrangement of the grooves 17, it is possible to apply the suction pressure between the first component 1 and the second component 2 distributed uniformly over the entire area of the component 1 or of the second component 2.

In addition, each fixed region, individual chip 18 having a surrounding, closed surface is pressed onto the second component 2 or the other component 21. This guarantees that each individual chip 18 is pressed with a predetermined pressure. A surrounding, closed bonding surface is thereby produced around each individual chip 18.

Individual chips may, for example, represent electronic circuits or micromechanical actuators or sensors. Other structures of grooves 17 may also be arranged corresponding to the structuring of the silicon wafer 19.

What is claimed is:

1. A method for producing a component using anodic bonding, comprising the steps of:

arranging a bonding layer between first and second silicon components, at least one of the bonding layer and the first and second components being structured such that a cavity is formed in at least one of the first component and the second component, the cavity abutting portions of the first and second components;

pressing the first and second components towards one another by producing a partial vacuum in the cavity, the partial vacuum being produced in the cavity by applying the partial vacuum to a suction channel of a holder device on which the first component is arranged, the suction channel being in fluid communication with at least one through-opening in the first component, the at least one through-opening leading to the cavity and being arranged substantially in a region of the suction channel;

heating at least one of the first and second components to a predetermined temperature; and applying a predetermined voltage to the first and second components, wherein a bonding connection is formed between the first and second components.

2. The method according to claim 1, wherein the bonding layer is composed of glass.

3. The method according to claim 1, wherein the holder device includes a heating device.

4. The method according to claim 1, wherein the partial vacuum is produced in the cavity by a suction device, the suction device being in fluid communication with the at least one through-opening.

5. The method according to claim 4, wherein the voltage is applied via the suction device, the suction device including a contact electrode.

6. The method according to claim 1, further comprising the step of:

arranging a top component on the second component so that a further cavity is formed, the second component having a further through-opening in fluid communication with the further cavity, the first and second components being pressed together by the top component and the holder device.

7. The method according to claim 6, further comprising the step of arranging another component having another through-opening between the first component and the top component.

8. The method according to claim 1, wherein at least one of the first and second components includes a silicon wafer divided into a plurality of fixed regions, each of the fixed regions being enclosed by a surrounding groove, the surrounding grooves being connected to one another to form a continuously connected cavity.

9. The method according to claim 8, wherein the fixed regions are individual chips.

10. A method for producing a component using anodic bonding, comprising the steps of:

arranging a bonding layer between first and second silicon components, the first component having a first cavity and the second component having a second cavity, the first and second cavities being arranged so that the first cavity is in fluid communication with the second cavity;

pressing the first and second components towards one another by producing a partial vacuum in the first and second cavities, the partial vacuum being produced in the first and second cavities by a suction device in fluid communication with a through-opening in one of the first and second components, the through-opening being in fluid communication with the first and second cavities;

heating at least one of the first and second components to a predetermined temperature; and applying a predetermined voltage to the first and second components, wherein a bonding connection is formed between the first and second components.

* * * * *